US006905782B2

(12) United States Patent
Laurello et al.

(10) Patent No.: US 6,905,782 B2
(45) Date of Patent: Jun. 14, 2005

(54) TARNISH DETERRING TIN COATING

(75) Inventors: Christopher P. Laurello, Milford, CT (US); Derek E. Tyler, Cheshire, CT (US); Szuchain Chen, Orange, CT (US); Julius C. Fister, Hamden, CT (US)

(73) Assignee: Olin Corporation, Waterbury, CT (US)

( * ) Notice: Subject to any disclaimer, the term of this patent is extended or adjusted under 35 U.S.C. 154(b) by 0 days.

(21) Appl. No.: 10/930,316

(22) Filed: Aug. 31, 2004

(65) Prior Publication Data

US 2005/0025990 A1 Feb. 3, 2005

Related U.S. Application Data

(63) Continuation of application No. 09/657,794, filed on Sep. 8, 2000.

(51) Int. Cl.[7] ......................... B32B 15/04; B32B 15/08; B32B 15/18; B32B 15/20

(52) U.S. Cl. ....................... 428/646; 428/626; 428/647; 428/648; 428/674; 428/658; 428/332; 428/336; 428/610; 428/457; 428/644; 174/126.1

(58) Field of Search ................................ 428/626, 643, 428/644, 646, 647, 648, 658, 659, 674, 687, 213, 220, 332, 339, 334, 335, 547, 548, 457, 458, 697, 699, 645, 610, 336, 679, 705, 668, 706, 707; 174/126.1, 126.2; 257/666

(56) References Cited

U.S. PATENT DOCUMENTS

| | | | |
|---|---|---|---|
| 4,883,774 A | 11/1989 | Djennas et al. | 437/211 |
| 5,510,197 A | 4/1996 | Takahashi et al. | 428/670 |
| 6,596,621 B1 | 7/2003 | Copeland et al. | 438/614 |

FOREIGN PATENT DOCUMENTS

| | | |
|---|---|---|
| JP | 01-283780 | 11/1989 |
| JP | 01-306574 | 12/1989 |
| JP | 02-301573 | 12/1990 |

*Primary Examiner*—Michael La Villa
(74) *Attorney, Agent, or Firm*—Todd E. Garabedian; Elizabeth A. Galletta; Wiggin and Dana LLP

(57) ABSTRACT

The present invention is directed to a coated substrate, comprising: an antitarnish layer deposited on a substrate in an amount effective to prevent tarnishing of said coated substrate; and an outer layer deposited onto said antitarnish layer, said outer layer comprising tin or tin alloys having at least 50% by weight tin. The present invention is also directed to coated substrates having a concentration gradient of antitarnish agent diffused into the coating, as well as methods of forming such coated substrates.

16 Claims, 2 Drawing Sheets

30
20
10

TARNISH DETERRING TIN COATING

CROSS REFERENCE TO RELATED APPLICATIONS

This Patent Application is a continuation of U.S. patent application Ser. No. 09/657,794, entitled "TARNISH DETERRING TIN COATING," which was filed on Sep. 8, 2000.

BACKGROUND OF THE INVENTION

1. Field of the Invention

The invention relates to tin coatings that resist tarnishing and discoloration, and more particularly to a coating made from an antitarnish layer and a tin-base layer deposited over the antitarnish layer. The layers may be combined to form a gradient of antitarnish agent within the tin-base layer. The invention also relates to methods of making the above coatings.

2. Background of the Invention

Oxidation and tarnishing of electrical contact surfaces generally results in high electrical contact resistance, thereby reducing performance of electrical devices. In addition, oxidation and tarnishing of electrical contact surfaces reduces the wettability of solder, and generally makes soldering problematic. Therefore, compositions and methods to reduce oxidation and tarnishing of electrical contacts have been pursued in the art.

One method to reduce oxidation or tarnishing of electrical contacts, and particularly copper or copper alloy leadframes and electrical connectors, is to apply a layer of tin metal onto the copper surface. The tin metal layer acts as a barrier to prevent or reduce oxidation, and thereby maintain the electrical performance of the copper contact. However, under certain conditions (e.g., elevated temperatures in air or other oxygen containing atmospheres), tin coatings have a tendency to oxidize and produce a yellowish oxide film that discolors the surface of the tin coating. Although the oxide film is typically only about 50–200 Angstroms in thickness, the surface of the tin may turn a distinct yellow color, which is undesirable to many consumers. In addition, under certain conditions (e.g., elevated temperature environments), the oxidation layer may attain a thickness that degrades the contact resistance of a coated electrical terminal. The latter conditions are especially prevalent in automobile engine compartments where electrical components such as connectors must endure high local temperatures.

Attempts have been made to address the problem of oxidation of tin coatings. The following patents and publications represent the general state of the art:

U.S. Pat. No. 5,780,172 is drawn to a copper or copper alloy substrate, tin or tin alloy coating layer with a barrier layer between the substrate and the coating layer. The barrier layer is either a copper/nickel layer containing 25%–40% of nickel or a multilayer structure having a copper layer in direct contact with the coating layer.

U.S. Pat. No. 5,916,695 is drawn to a copper or copper alloy substrate, tin or tin alloy coating layer with a barrier layer between the substrate and the coating layer. The barrier layer contains from 20%–40% of nickel and a flash is disposed between the barrier layer and the substrate.

A publication entitled "An Examination of Oxide Films on Tin and Tin Plate" by S. C. Britton and K. Bright discloses that the addition of small amounts of phosphorous, indium or zinc to tin prevents the formation of color films when the metal is heated. Although this article recognizes the need to prevent oxidation of tin, it does not disclose an efficient method to introduce oxide resisting elements into the tin coating such that these elements have an increased concentration at the surface of the tin that is exposed to ambient air.

Japanese Kokai No. 3(1991)-239,353 published Oct. 24, 1991, discloses a copper leadframe for semiconductor devices. This reference describes placing zinc between a copper leadframe and a tin coating. The zinc layer is introduced to prevent diffusion between the tin coating and the copper leadframe. This reference also fails to disclose an efficient method for applying selected oxide resistant elements into a surface of a tin layer exposed to ambient air.

Published PCT Application No. WO 99/51363 discloses a tin coated electrical or electronic component that possesses enhanced resistance to oxidation and tarnishing as well a smaller increase in contact resistance when exposed to elevated temperatures. These benefits are achieved by depositing a relatively thin (e.g., 5–50 angstroms thick) layer of zinc onto the tin coating prior to heating. A subsequent step of heating the sample to a temperature and time effective to convert all free tin to an intermetallic imparts the additional advantage of reducing the coefficient of friction. However, there is a need for improving the robustness and durability of the coating during processing or handling.

As can be seen from the illustrative background discussed above, there is a need for alternative methods of preventing oxidation of tin in electrical conductors and contacts. The present invention is believed to be an answer to that need.

BRIEF SUMMARY OF THE INVENTION

In one aspect, the present invention is directed to a coated substrate, comprising: an antitarnish layer deposited on a substrate in an amount effective to prevent tarnishing of the coated substrate; and an outer layer deposited onto the antitarnish layer, the outer layer comprising tin or tin alloys having at least 50% by weight tin.

In another aspect, the present invention is directed to a coated substrate comprising a coating on a substrate, the coating having a first surface and a second surface, the second surface positioned adjacent to the substrate, and comprising: a metal layer comprising tin or tin alloys having at least 50% by weight tin; and a concentration gradient of antitarnish agent diffused into the metal layer, the concentration gradient having the highest concentration of the antitarnish agent at the second surface, the antitarnish agent present in the coating in an amount effective to prevent tarnishing of the coating; and wherein the coating has a thickness between 10 microinches and 1000 microinches.

In another aspect, the present invention is directed to a method of forming a coated substrate, comprising the steps of: (1) depositing an antitarnish layer comprising an antitarnish agent onto a substrate, the antitarnish layer deposited onto the substrate in an amount effective to prevent tarnishing of the coated substrate following diffusion of the antitarnish layer into the metal layer; (2) depositing a metal layer onto the antitarnish layer, the metal layer comprising tin or tin alloys having at least 50% by weight tin; and (3) diffusing the antitarnish layer into the metal layer to form a concentration gradient of the antitarnish agent within the metal layer, the concentration gradient having the highest concentration of the antitarnish agent at the substrate, to form the coated substrate.

These and other aspect will be described in more detail in the following detailed description of the invention.

BRIEF DESCRIPTION OF THE FIGURES

The invention will be more fully understood from the following detailed description taken in conjunction with the accompanying figures in which.

DETAILED DESCRIPTION OF THE INVENTION

It has been surprisingly found, in accordance with the present invention, that oxidation and discoloration of tin base coatings or tin alloy coatings may be significantly reduced or completely eliminated by application of an antitarnish undercoating layer positioned between the tin base coating and the substrate. Locating the antitarnish layer between the substrate and the tin base coating, in accordance with the present invention, is particularly advantageous in connector applications because mechanical erosion or degradation of the antitarnish layer is prevented. In addition to preventing oxidation and discoloration of the tin base layer, the antitarnish undercoating layer does not interfere with the aesthetic quality of the tin base coating and provides for an aesthetically pleasing surface.

As defined herein the term "base" used in association with a metal (e.g., copper base, tin base, etc.) refers to an alloy that contains at least 50 wt % of the specified element. The term "alloy" refers to a mixture of two or more metals, or of one or more metals with certain nonmetallic elements. The term "diffused" as defined herein refers to the introduction of one substance into another substance so as to affect the second substance. The term "concentration gradient" refers to a specified amount of substance(s) per unit distance, and expressly includes nonlinear gradients (e.g., differing amounts of substance(s) per unit distance) as well as uniform distribution of substance(s) (i.e., gradient of zero).

As indicated above, the present invention is generally a coated substrate, comprising: an antitarnish layer deposited on a substrate in an amount effective to prevent tarnishing of the coated substrate; and an outer layer deposited onto the antitarnish layer, the outer layer comprising tin or tin alloys having at least 50% by weight tin. Each of these components is discussed in detail below.

Figure 1:
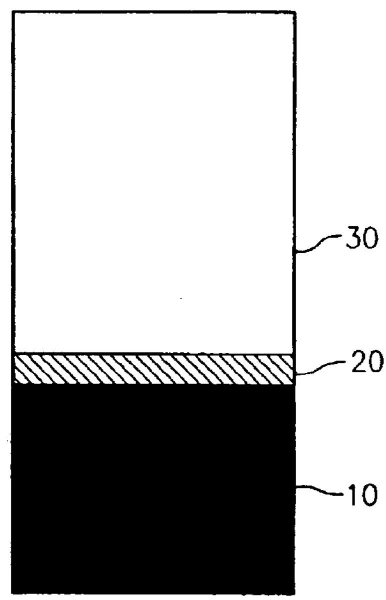
FIG. 1 depicts an arrangement of the coating of the invention.

Referring now to FIG. 1, the substrate 10 onto which the coating is deposited may be any substrate known in the art, including metal, plastic, composites, and the like. Particularly suitable substrates include metals, such as copper or copper base alloys found in electrical connectors, leadframes, electronic packaging, printed circuits, and the like.

Prior to application of the antitarnish coating, the substrate preferably is subjected to a degreasing process. An example of a commercial degreaser is an alkaline electrocleaner such as Hubbard-Hall's E-9354 electrocleaner (available commercially from Hubbard-Hall, Waterbury, Conn.). An alkaline mixture along with anodic/cathodic electrocleaning allows the oxygen or hydrogen to remove most deposits residing on the substrate. The electrocleaning process usually works most efficiently at 20–55° C. with a current density range of 10–50 asf.

The antitarnish layer 20 of the present invention is applied to the substrate, and includes an antitarnish agent. Preferably, the antitarnish agent is an element that has a greater negative free energy of oxide formation than tin, and preferentially forms an oxide. Elements useful as the antitarnish agent include zinc, chromium, indium, phosphorous, potassium, sodium, manganese, vanadium, boron, silicon, thallium, cerium, magnesium, aluminum, calcium, and the like, either individually or in combination (e.g., in alloy form). Another group of elements that could reduce oxide formation are noble metal such as silver, gold, platinum, and palladium, which can be employed individually, or alloyed with tin or another metal to reduce the tendency to form oxides. Additionally, the above antitarnish agents may be employed in the antitarnish layer either individually, or in combination of two, three, four, or more (e.g., in alloy form).

The antitarnish layer 20 can be applied to the substrate by any deposition method known in the art, for example, electroplating, immersion coating, vapor deposition, chemical vapor deposition, plasma deposition, metal spraying, rolling, gravure, and the like. Electroplating is one preferred and well-known method of method of depositing the antitarnish layer onto the substrate. Electroplating may be generally accomplished by immersing the substrate in a bath of antitarnish agent (e.g., 0.1 to 200 g/l of zinc chloride in an aqueous solution having a pH between 1 and 5 if zinc is used as part of the antitarnish layer). If an indium layer is desired as the antitarnish layer, an indium bath having 0.1 to 200 g/l of indium in an aqueous solution having a pH between 1 and 5 may be used. Preferably, the finished antitarnish layer deposited onto the substrate has a thickness between about 5 and about 1000 Angstroms, and more preferably between about 25 and about 500 Angstroms.

The outer layer 30 of the coating of the present invention includes a tin base (e.g., at least 50 wt % of tin), and is applied over the antitarnish layer. The application of the outer layer 30 may be accomplished by the methods described above for deposition of the antitarnish layer, e.g., electroplating, vapor deposition, chemical vapor deposition, plasma deposition, metal spraying, rolling, gravure, HALT (hot air level tin) process, mechanical wipe, and the like.

The electroplating method generally involves use of a tin ion-containing electrolyte to deposit a tin coating onto the substrate. One exemplary tin electrolyte contains between 10 g/l and 50 g/l tin and between 30 g/l and 70 g/l sulfuric acid in a electrolyzing bath. The bath is electrolyzed at a nominal temperature of 15–50° C. and at a current density of about 10–100 amps/ft$^2$ (asf). The bath typically deposits about 50 microinches of tin per minute.

Preferably, the thickness of the outer layer 30 ranges from about 10 to about 1000 microinches, more preferably from about 10 to 400 microinches, and most preferably from about 20 to about 80 microinches.

The outer layer can have a bright or matte finish, as desired. A bright finish may be achieved by adding proprietary organic compounds. The addition of such an organic material produces a tin coating with a smooth, harder surface. An example of the bright tin plating is given in the provided in the Enthone-OMI Sel-Rex Technical Data Sheet for "SOLDEREX TB"sulfate-based bright acid tin. This example applies 6.5 ounces per gallon of stannous sulfate, 7 vol % sulfuric acid, 0.63–3.5% Solderex additives, 65 asf cathode current density, and 15 asf anode current density at 21° C.

Alternatively, a matte finish on the tin coating may be produced by electroplating tin from a tin-sulfate bath that is known in the art for preparing this type of finish. An example is Lucent Technologies' "SNTECH SATINBRIGHT" high speed sulfate plating bath. The bath should be maintained preferably at 15–85° C., and more preferably 25–60° C., with agitation. Current density used during plating preferably ranges from 10–300 asf, and more preferably from 25–100 asf. The resulting finish has a "satin" appearance. Thick coatings are typically deposited, and have the advantage of a longer operational life and are appropriate for heavy-duty applications.

Additional metals such as lead may be included in the outer layer to form an alloy. For example, the outer layer may contain from 50% to 95% by weight tin and the balance lead. In one embodiment, the outer layer has 50% to 75% by weight tin and the remainder lead. A useful tin-lead alloy has 60% by weight tin and 40% by weight lead, and another tin-lead alloy has 63% by weight tin and 37% by weight lead. One particularly useful outer layer alloy includes tin and up to 50 wt % lead. Other useful alloying elements in the tin alloy include, but are not limited to, silver, bismuth, copper, indium, and combinations thereof.

The outer layer 30 may also include friction-reducing materials that reduce the coefficient of friction of the finished coating. These additional friction-reducing materials may be uniformly dispersed polymers such as polyimide, polyamide, polytetrafluoroethylene ("TEFLON"), silicon carbide, aluminum oxide, tungsten carbide, and molybdenum disulfide. Preferably, these materials will range in size from about 0.5 microns to about 3 microns. Typically, these materials represent from about 1 to about 30 wt % of the total composition. These materials reduce friction at the coating surface without significantly increasing contact resistance. Additional friction-reducing materials are disclosed in U.S. Pat. No. 5,028,492, which is herein incorporated by reference in its entirety.

Additional materials, such as zinc chloride, HCl, and indium chloride may also be added to the outer layer 30 to aid in further processing of the coating as described in more detail below. For example, the outer layer may be treated to brighten it or provide it with tarnish resistance.

Figure 2:
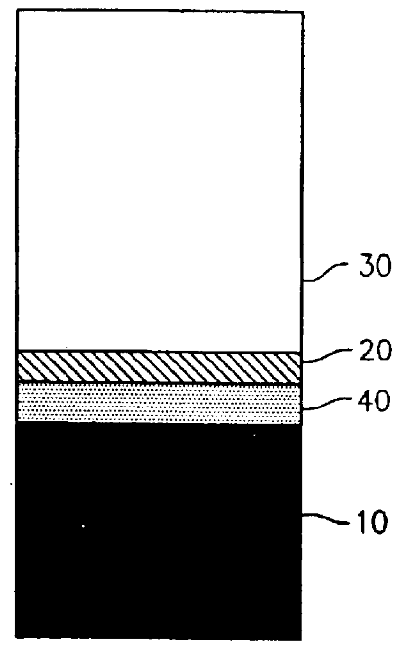
FIG. 2 depicts an alternative arrangement of the coating of the invention.

An additional barrier layer 40 may be optionally included in the coating of the invention (as shown in FIG. 2 where like numbers refer to like features). Such a barrier layer is preferably disposed between the substrate surface and the antitarnish layer. The barrier layer 40 reduces the rate of intermetallic formation between the substrate and the tin layers. Useful materials for the barrier layer include nickel, iron, cobalt and copper, and alloys and/or combinations thereof, and may be applied to the substrate by any of the methods described previously. One suitable barrier layer is a combination of copper and 10 to 70 wt % nickel applied at a thickness of from about 0.2 to 2.0 microns. Additional barrier layers are disclosed in U.S. Pat. No. 5,780,172 which is incorporated by reference in its entirety. The barrier layer may also be formed by plating alternating layers of different metals and then diffusing the layers to form a desired alloy.

After the layers have been applied, the outer layer 30 may be coated with a fluxing material such as zinc chloride, and subjected to reflow in a reflow furnace. The reflow step, described in more detail below, melts the tin base material of the outer layer where it diffuses into the antitarnish layer. A gradient of antitarnish agent is thus formed within the outer layer, with the highest concentration of antitarnish agent located at the substrate surface (or barrier surface if the barrier layer is used).

The process of applying the coating is generally performed in a continuous process as follows, although stepwise applications may also be used.

The substrate (generally a copper or copper base alloy strip) is first electrocleaned in an alkaline bath in the presence of an electric current. The electrocleaning generates hydrogen gas on the surface of the substrate to remove any oxidation or other surface contaminants.

In a preferred embodiment, following the electrocleaning step, the substrate is rinsed with deionized water and the barrier layer is applied. The barrier layer application is generally performed by electroplating as described above. However, alternative methods, such as vapor deposition, chemical vapor deposition, plasma deposition, metal spraying, rolling, gravure, mechanical wipe, and the like, may also be suitably employed. The substrate is rinsed again in deionized water, and the antitarnish layer is then applied, preferably by electroplating, although other deposition methods described above may suitably be used. As indicated above, the thickness of the antitarnish layer is between about 5 and about 2500 Angstroms, more preferably between about 5 and about 1000 Angstroms, and most preferably between about 5 and about 500 Angstroms.

Following deposition of the antitarnish layer, the substrate is again rinsed in deionized water and the outer layer is applied. As indicated above, the outer layer includes tin or a tin base alloy, and is applied to the antitarnish layer preferably by electroplating. The thickness of the outer layer ranges from about 10 to about 1000 microinches, more preferably from about 20 to 400 microinches, and most preferably from about 20 to about 80 microinches.

Figure 3:
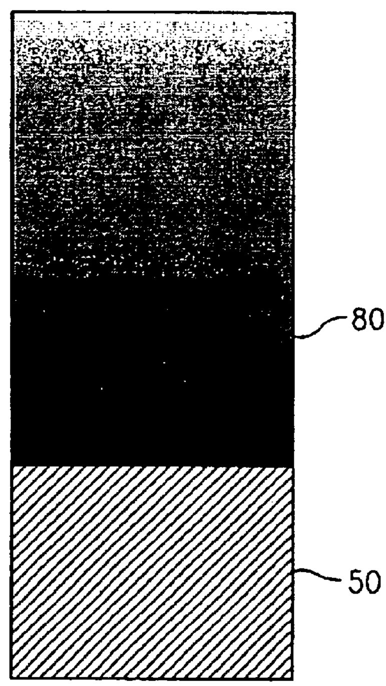
FIG. 3 depicts an arrangement of the coating of the invention showing a gradient of material.
Figure 4:
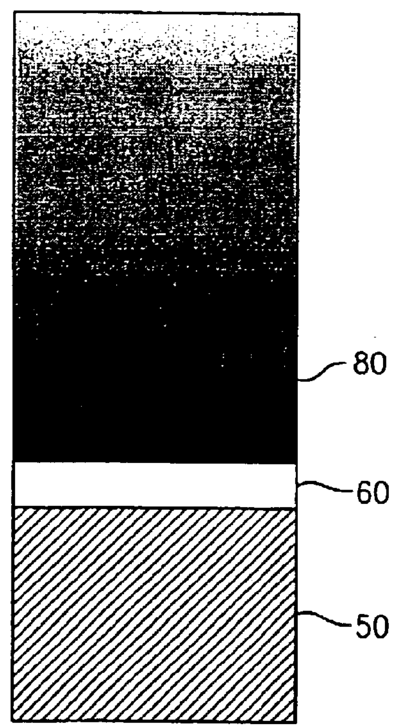
FIG. 4 depicts an alternative arrangement of the coating of the invention showing a gradient of material.

At this point, the substrate is now coated with the coating and may be utilized. Alternatively, the coated substrate may be further processed as follows:

After another rinse with deionized water, zinc chloride is applied to the outer layer. Generally, this application is performed by dipping the coated substrate into a solution of zinc chloride (e.g., 0.1 to 200 g/l, with pH between 1 and 5). The zinc chloride solution is dried, and then the coated substrate is subjected to reflow in a reflow furnace. During the reflow process, the coated substrate is moved through a reflow furnace held at a temperature of between 240 and 600° C. at a rate of between about 5 and about 500 feet/minute. At the proscribed temperature, the tin in the outer layer melts, and the zinc layer diffuses into the tin layer. A gradient of antitarnish agent is thus formed within the outer layer, with the highest concentration of antitarnish agent located at the substrate surface (as shown in FIG. 3). As described above, a barrier layer 60 may be deposited between the substrate 50 and the gradient of antitarnish agent 80 (as shown in FIG. 4). The reflow step establishes a gradient of antitarnish agent 80 wherein the higher concentration of antitarnish agent is adjacent to the barrier layer 60.

Although a gradient of antitarnish agent is exemplified in one embodiment of the present invention, it is also possible to establish a uniform distribution of antitarnish agent (e.g., a gradient of zero) throughout the coating, when appropriate.

Following the reflow step, the gradient of antitarnish agent infused into the tin base coating preferably ranges (linearly or nonlinearly) from about 0.001 to 5 wt %, more preferably from about 0.005 to 3 wt %, and most preferably from about 0.01 to 2 wt %, all based on the total weight of the tin-base coating.

The coated substrate is next cooled in a quench tank, dried, and wound into coils.

The wound coils of coated substrate may be optionally further processed by heating in an oven at 150–200° C. for 1–75 hours. This optional heating step allows the tin to further diffuse into the barrier layer and thereby produce intermetallic compounds (e.g., $Cu_3Sn$, $Cu_6Sn_5$), while reducing the concentration of free tin at the surface of the coated substrate. The reduction in the thickness of free tin at the surface of the coated substrate results in a smooth, hard surface with a low coefficient of friction (about 0.1 to about 0.3). The resulting smooth, hard surface with a low coefficient of friction is particularly suitable for connector applications where insertion wear can prematurely degrade electrical connections. Without wishing to be bound by any particular theory, it is believed that the Zn underlay maintains a low contact resistance with little or no free tin after heat treatment to consume the free tin.

EXAMPLES

The following examples are intended to illustrate, but in no way limit the scope of the present invention. All parts and percentages are by weight and all temperatures are in degrees Celsius unless explicitly stated otherwise.

Deposition of Antitarnish Layers

The general steps for depositing the coating compositions of the present invention are as follows:

A selected substrate is first electrocleaned to remove oils and other contaminants from the substrate surface. A sodium hydroxide-based or other alkaline cleaner is used in an anodic cleaning process to clean the substrate surface. The electrocleaning process usually works most efficiently at 20–55° C. with a current density range of 10–50 asf. The substrate is then rinsed clean with DI water. The substrate then undergoes an activation step where the surface is exposed to a sulfuric acid dip. After another DI water rinse, the antitarnish layer is deposited onto the substrate using techniques known in the art as discussed hereinabove. Following another DI water rinse, the outer layer comprising tin is deposited over the antitarnish layer. Following another DI water rinse, the coated substrate is subjected to a post-plating activation dip prior to reflow. Typically, the substrate is on a conveyor belt moving at 5–500 ft/min, and then enters a reflow furnace maintained at a temperature of 240° C.–600° C., thus reflowing the tin coating. The tin is then quenched in water, preferably deionized (DI) water.

By way of illustration, a copper alloy substrate (7 inches by 1.25 inch by 0.02 inches of C7025 copper alloy from Olin Corporation, Norwalk, Conn.) is cleaned in 30 g/l of a sodium hydroxide-based cleaner (Product No. E-9354 electrocleaner from Hubbard-Hall Corp, Waterbury, Conn.). The electrocleaner is heated to 55° C. and is maintained at constant agitation during the electrocleaning process (30 asf for 50 seconds). After electrocleaning, the copper substrate is rinsed in DI water, and then undergoes an activation step where the surface is exposed to a 20% sulfuric acid dip for 5 seconds. Following another DI water rinse, a barrier layer of nickel and copper is electrodeposited at 30 asf. The nickel is plated using a nickel sulfamate bath at 90 g/l nickel with a nickel anode, agitation, and 50° C. heating. U.S. Pat. Nos. 5,780,172 and 5,916,695, both of which are incorporated by reference in their entireties, provide details of these procedures.

Before the copper layer is deposited, another DI water rinse cleans the nickel-plated surface. A standard acid-copper sulfate bath is used to deposit the copper layer, as well as a copper anode, agitation, and room temperature control. Another DI water rinse follows, and the tarnish-deterring barrier (generally zinc) is then deposited from a zinc bath of 2 g/l zinc chloride and DI water under conditions of 0.5 asf, zinc anode, agitation, and 55° C. temperature control. Following another DI water rinse, the 50 μinch of tin coating is deposited onto the zinc layer. The tin plating bath is acid-sulfate based containing 60 g/l stannous sulfate and is deposited under conditions of 30 asf, a tin anode, agitation, and room temperature control. Following another DI water rinse, the coated substrate is subjected to a post-plating activation dip using 1 g/l zinc chloride prior to reflow. After the sample is dried, the tin coating is melted on a hot plate at about 300° C. to reflow the tin. The reflow process is quenched in DI water immediately. The coated substrates were evaluated as described below.

Tarnish Test Substrates coated with the above coating composition were placed on a hotplate maintained at about 300° C. to determine whether the applied coating layers deterred yellowing with Standard reflow, nickel barrier reflow, copper barrier reflow, and Ni/Cu barrier reflow. The results are shown in Table I.

TABLE I

300° C. Hot Plate Test (Zinc Barrier, 25 Angstroms) Effect on Reflow Tarnishing

| Exposure (sec) | Cu Barrier Only | Ni Barrier Only | Ni/Cu Barrier | Cu/Zn Barrier | Ni/Zn Barrier | Ni/Cu/Zn Barrier |
|---|---|---|---|---|---|---|
| 30 | Tarnish | Slight Tarnish | Tarnish | No Tarnish | No Tarnish | No Tarnish |
| 60 | Tarnish | Tarnish | Tarnish | No Tarnish | No Tarnish | No Tarnish |
| 90 | Tarnish | Tarnish | Tarnish | No Tarnish | No Tarnish | No Tarnish |
| 120 | Tarnish | Severe Tarnish | Tarnish | No Tarnish | No Tarnish | No Tarnish |

As shown in Table I, coating compositions including a zinc layer effectively deterred tarnish of the tin layers.

Solderability Test Substrates coated with the above coating composition were dipped in 60-40 Tin-Lead Solder for 6 seconds after being coated with Alpha 100 Flux. The solder coated samples were analyzed for levels of dewetting.

The coating compositions did not affect Solderability in the as-received condition, or after 8 hr. steam aging in a 100% humidity chamber at 93° C. According to ASTM Solderability Standard MIL-STD 883D, all of the samples were of a Class II ranking (>95% wetting). The exposure to humidity did not alter the level of dewetting. These results are consistent with typical tin reflow products.

Contact Resistance Test Contact resistance of the coated samples was evaluated by gold probe electrical resistance testing, following ASTM standards B539-80 and B667-80. The gold probe testing measured electrical resistance with 25–500 gram normal loads. The samples were heat-aged at 150° C. for one and three weeks, and electrical resistance was measured. The results are shown in Table II below:

TABLE II

Analysis of Contact Resistance (Ohms)

| Sample | Alloy | Coating Type | Total Sn (μin) | Rc@100 gr 1 wk × 150° C. (Ω) | Rc@100 gr 3 wks × 150° C. (Ω) |
|---|---|---|---|---|---|
| C194/30 μin Cu/Sn | C194 copper | Standard Reflow | 40–50 | 0.01126 | 0.01392 |
| C194/30 μin Cu/50 Å Zn/Sn | C194 copper | Standard Reflow | 40–50 | 0.00797 | 0.008097 |

As shown in Table II, samples including zinc underplating showed improved contact resistance.

Reflectivity Test A ruler is placed perpendicular to the coated surface and the length of ruler that can be clearly reflected is recorded. Deviations from a clear reading give a qualitative estimate of the degree of tarnish on the surface coating. Standard reflow without the tarnish deterring barrier typically allows for a clear reflection up to 10 inches. Substrates coated with the coating composition of the invention showed the cosmetic reflection unchanged from Standard Reflow.

Coefficient of Friction Analysis Substrates coated with various combinations of the coating composition of the invention were evaluated for the magnitude of coefficient of friction. Coefficient of friction measures the resistive force relative to the normal force when tin coated bump (1.6 mm hemisphere) slides 5 mm at 6 mm/sec across a tin coated flat surface. The normal load of 250 grams is applied to the coated substrate, and the instrument measures the resistive force. The R/N values are determined by dividing the resistive force by the normal force. The results are shown in Table III.

TABLE III

Analysis of Coefficient of Friction

| Coating/Treatment Type | Free Tin ($\mu$inches) | R/N |
|---|---|---|
| 40–80 $\mu$inch reflow Sn | 50 | 0.46 |
| 40–80 $\mu$inch reflow Sn, Zn antitarnish layer, followed by heat treatment | 0–5 | 0.10–0.18 |
| Cu/Ni barrier, 20–40 $\mu$inches reflow Sn, Zn antitarnish layer | 16 | 0.29 |
| Cu/Ni barrier, 40–80 $\mu$inches reflow Sn, Zn antitarnish layer | 26 | 0.375 |
| 40–80 $\mu$inches reflow Sn, Zn antitarnish layer applied at 4 Amps | 44 | 0.43 |
| 40–80 $\mu$inches reflow Sn, Zn antitarnish layer applied at 6 Amps | 45 | 0.49 |

As shown in Table III, substrates heat treated to reduce the free tin thickness display reduced coefficients of friction (measured as R/N) in the 0.10–0.18 range as compared to standard reflow processes (0.36 to 0.53).

Figure 5:
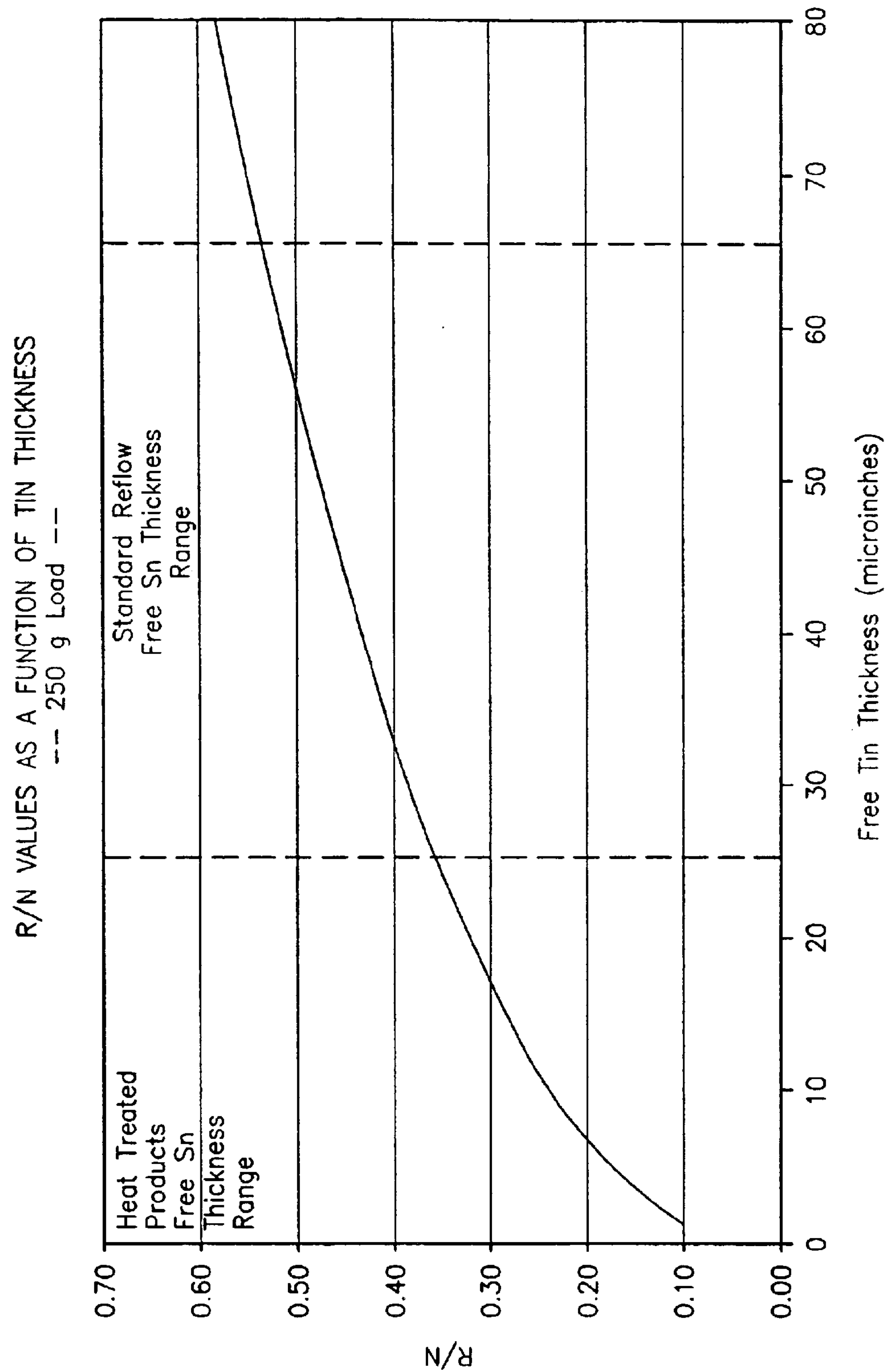
FIG. 5 is a graph showing the relationship between coefficient of friction values (expressed as R/N) and free tin thickness.

The data describe a relationship between the coefficient of friction (R/N) as a function of the tin thickness in the layers, and is shown graphically in FIG. 5. The relationship was fit to a curve, and expressed as $$R/N=0.1563\times LN(\text{free tin})-0.1398,$$

with a correlation coefficient of $r^2=0.9285$.

Although the invention has been shown and described with respect to illustrative embodiments thereof, it should be appreciated that the foregoing and various other changes, omissions and additions in the form and detail thereof may be made without departing from the spirit and scope of the invention as delineated in the claims. All patents and patent applications mentioned are herein incorporated by reference in their entirety.

What is claimed is:

1. A coated substrate, comprising:

an antitarnish layer deposited on a substrate; and an outer layer deposited onto said antitarnish layer, said outer layer comprising tin or tin alloys having at least 50% by weight tin, and wherrein said antitarnish layer is present in an amount effective to prevent tarnishing of said outer layer and said antitarnish layer comprises an antitarnish agent of zinc, wherein said antitarnish layer has a thickness of between 5 and 1000 Angstroms.

2. The coated substrate of claim 1, wherein said antitarnish layer has a thickness of between 5 and 500 Angstroms.

3. The coated substrate of claim 1, wherein said outer layer has a thickness of between 10 and 1000 microinches.

4. The coated substrate of claim 3, wherein said outer layer has a thickness of between 10 to 400 microinches.

5. The coated substrate of claim 1, further comprising a barrier layer disposed between said substrate and said antitarnish layer.

6. The coated substrate of claim 5, wherein said barrier layer comprises an element selected from the group consisting of nickel, tin, iron, cobalt, copper, manganese, and combinations thereof.

7. The coated substrate of claim 1, wherein said outer layer further comprises a friction-reducing material selected from the group consisting of polyimide, polyamide, polytetrafluoroethylene, silicon carbide, aluminum oxide, tungsten carbide, molybdenum disulfide, and combinations thereof.

8. The coated substrate of claim 1, wherein said substrate comprises copper or a copper alloy.

9. A coated substrate comprising a coating on a substrate, said coating having a first surface and a second surface, said second surface positioned adjacent to said substrate, and comprising:

a metal layer comprising tin or tin alloys having at least 50% by weight tin; and a nonzero concentration gradient of antitarnish agent diffused into said metal layer, said nonzero concentration gradient having the highest concentration of said antitarnish agent at said second surface, said antitarnish agent present in said coating in an amount effective to prevent tarnishing of said metal layer, wherein said antitarnish agent is zinc;

and wherein said coating has a thickness between 10 microinches and 1000 microinches; and wherein said coating further comprises a friction-reducing material that imparts said coating with a coefficient of friction in the range of from 0.1 to 0.3, said friction-reducing material selected from the group consisting of polyimide. polyamide, polytetrafluoroethylene, silicon carbide, aluminum oxide, tungsten carbide, molybdenum disulfide, and combinations thereof.

10. The coated substrate of claim 9, wherein said coating has a thickness of between 10 to 400 microinches.

11. The coated substrate of claim 9, wherein the amount of antitarnish agent in said coating ranges from 0.001 to 5 wt %, based on the total weight of said coating.

12. The coated substrate of claim 11, wherein the amount of antitarnish agent in said coating ranges from 0.005 to 3 wt %, based on the total weight of said coating.

13. The coated substrate of claim 12, wherein the amount of antitarnish agent in said coating ranges from 0.01 to 2 wt %, based on the total weight of said coating.

14. The coated substrate of claim 9, further comprising a barrier layer disposed between said second surface and said substrate.

15. The coated substrate of claim 14, wherein said barrier layer comprises an element selected from the group consisting of nickel, tin, iron, cobalt, copper, manganese and combinations thereof.

16. The coated substrate of claim 9, wherein said substrate comprises copper or copper alloy.

* * * * *